United States Patent [19]
Imaide

[11] Patent Number: 4,796,071
[45] Date of Patent: Jan. 3, 1989

[54] CHARGE COUPLED DEVICE DELAY LINE

[75] Inventor: Takuya Imaide, Yokohama, Japan
[73] Assignee: Hitachi, Ltd., Tokyo, Japan

[21] Appl. No.: 893,181
[22] Filed: Aug. 5, 1986
[30] Foreign Application Priority Data
Aug. 5, 1985 [JP] Japan ................................ 60-171089
[51] Int. Cl.[4] ............................................ H01L 29/78
[52] U.S. Cl. ..................................................... 357/24
[58] Field of Search .......................................... 357/24

*Primary Examiner*—Robert S. Macon
*Attorney, Agent, or Firm*—Antonelli, Terry & Wands

[57] ABSTRACT

In a CCD delay line having an input stage and a transfer stage, a signal charge produced at the input stage and transferred to the transfer stage is decreased at a region of the transfer stage which is near the input stage. Since the signal charge to be transferred is decreased, power consumption in the transfer stage is decreased. Because a noise charge mixed with the signal charge at the input stage is also decreased by this decrease for signal charge, the S/N ratio is not decreased.

4 Claims, 8 Drawing Sheets

ID IG IS H3 H2 H1
2 3 11 12 13 17 19
φg φs φℓ φh
φg φs φℓ φh φh'
φg φs φℓ φh

FIG. 4(a)
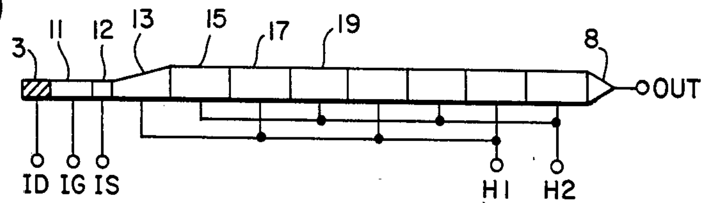
FIG. 4(b)
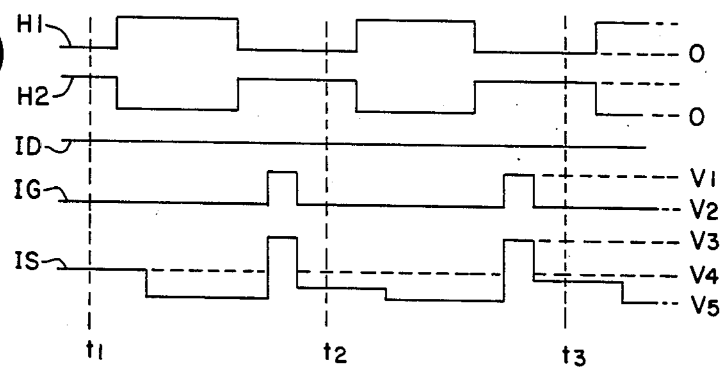
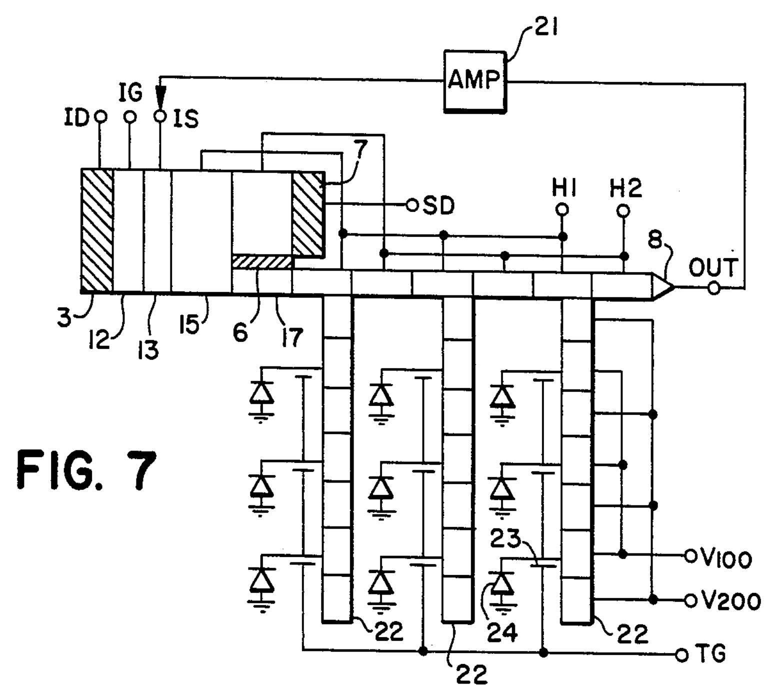
FIG. 7

CHARGE COUPLED DEVICE DELAY LINE

BACKGROUND OF THE INVENTION

The present invention relates to a CCD delay line of low noise level and low power consumption.

As disclosed in U.S. Pat. No. 3,986,198, the CCD delay line has already been put into practice for processing the signals for a video camera or the like. This CCD delay line has a problem in the requirement of a high driving power so that it obstructs a long-time image pickup of such a video camera when it is driven by a battery. The driving power P is expressed basically by the following equation:

$$P=fCV^2 \quad (1),$$

wherein: f is a clock frequency; C is a full gate capacity; and V is a clock amplitude (i.e., the peak-to-peak value of the voltage). In the case of f=10 MHz, C=200 pF and V=10 V, for example, P=0.2 W. Let the case be assumed in which four such CCD delay lines are used. Then, the CCD delay lines will require about 0.8 W, which is a high burden on a video camera which normally has a total power consumption of about 3 W.

For a lower power consumption, as found from equation (1), it is necessary to reduce the gate capacity C or the clock amplitude V. With this reduction of either value, however, the amount of signal charge to be handled drops to degrade the S/N ratio.

SUMMARY OF THE INVENTION

It is an object of the present invention to provide a charge coupled device delay line whose power consumption is reduced.

In accordance with the present invention, a charge coupled device is provided with input means for producing a signal charge in response to an electrical signal applied thereto. A transfer means is also provided which has one end coupled to said input means and another end. The transfer means operates to transfer the signal charge from said one end to said another end. The transfer means includes means adjacent to said one end thereof for decreasing said signal charge to be transferred.

BRIEF DESCRIPTION OF THE DRAWINGS

FIGS. 4 and 6 show whole CCD delay lines shown in FIG. 3 and FIG. 5, respectively; and FIGS. 7 to 10 show image pickup equipment or the like using the present invention.

DESCRIPTION OF THE PREFERRED EMBODIMENTS

Figure 1A:
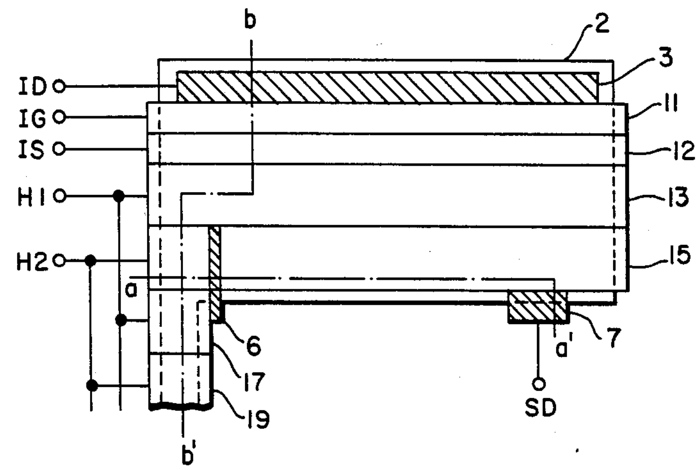
FIG. 1 shows a part of a first embodiment of the present invention.
Figure 1B:
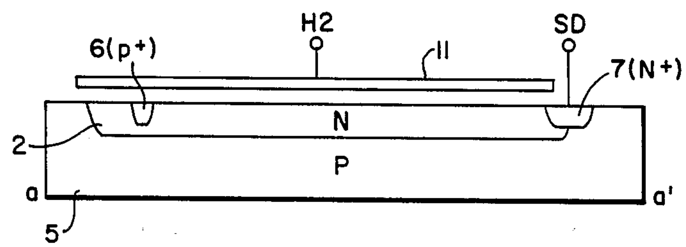
Figure 1C:
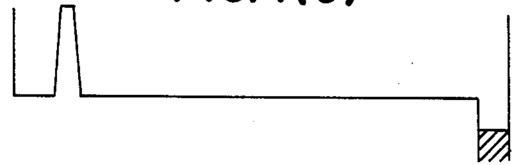
Figure 1D:
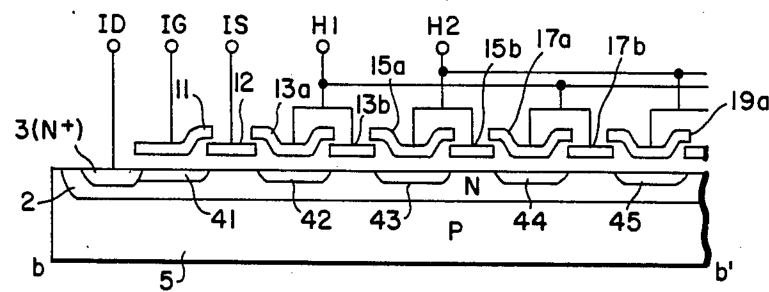
Figure 1E:
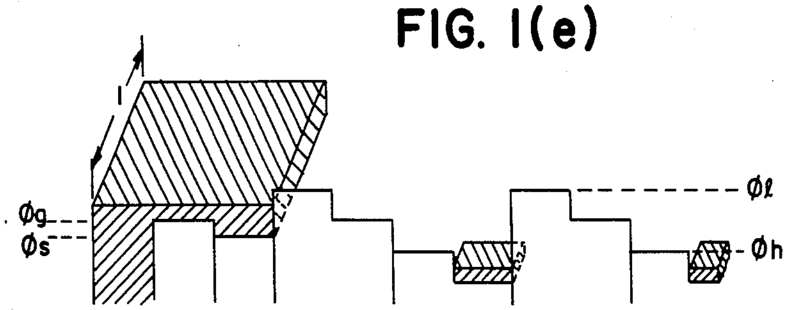
Figure 1F:
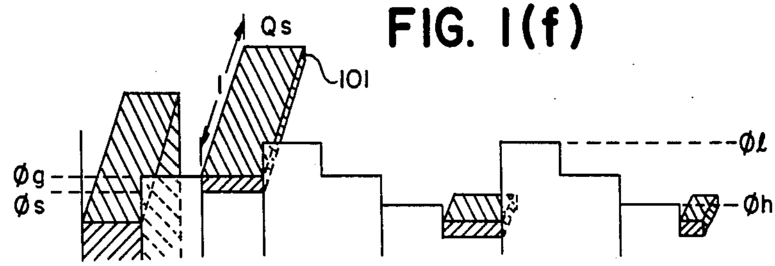
Figure 1G:
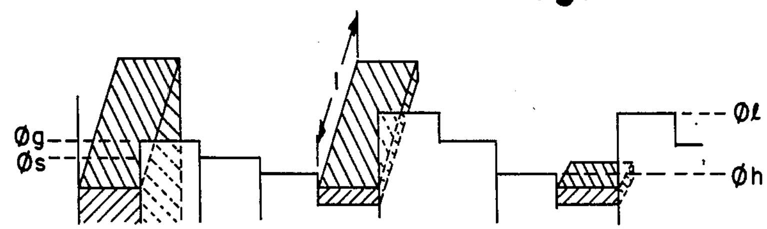
Figure 1H:
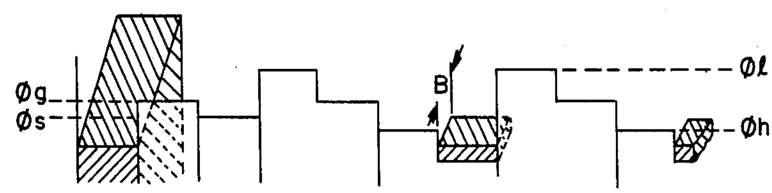

FIG. 1 shows a portion of one embodiment of the present invention. FIG. 1(*a*) shows a planar structure; FIG. 1(*b*) shows a vertical structure along a section a—a' of FIG. 1(*a*); FIG. 1(*c*) is a potential diagram corresponding to the vertical structure; FIG. 1(*d*) is a vertical structure along a section b—b' of FIG. 1(*a*); and FIGS. 1(*e*) to 1(*h*) are potential diagrams for explaining the operations.

Numeral 2 indicates an N-type diffusion layer (e.g. depth≈1 μm) in a P-type substrate 5 to form a channel for a signal charge. Numeral 3 indicates an N+-type diffusion layer (e.g. L/W≈1 μm/40 μm) acting as a negative charge supply source when a negative voltage is applied thereto through terminal ID. Indicated at numerals 41 to 45 are P-type diffusion layers which are spaced with each other in the upper side of diffusion layer 2 to impart a directivity to a transfer channel (see FIG. 1(*d*)).

An electrical signal is, for instance, applied between terminal IG connected to gate 11 (e.g. L/W≈1 μm/50 μm) positioned above P-type diffusion layer 41 and terminal IS connected to gate 12 positioned above N-type diffusion layer 2 between P-type diffusion layers 41 and 42. The channel formed below gates 11 and 12 is the input stage. The channel formed below gates 13 to 19 is the transfer stage, gates 13 (e.g. L/W≈2 μm/50 μm) and 17 (e.g. L/W≈2 μm/5 μm) being applied with a first transfer clock through terminal H1, and gates 15 and 19 being applied with a second transfer clock through terminal H2. Each gate 13 to 19 is formed in this embodiment with a pair of gates, such as 13*a* and 13*b* shown in FIG. 1(*d*).

Between gates 13*a*, 15*a*, etc. and P-type diffusion layers 41 to 45, between gates 13*b*, 15*b*, etc. and N-type diffusion layer 2 and between gates 13*a*, 15*a*, etc. and gates 13*b*, 15*b*, etc., there is formed an insulating oxide film which is made of silicon dioxide or the like, although omitted from the drawing for purposes of drawing simplification.

Injection of the signal charge is conducted in the following manner. At first, the voltage of an ID terminal is dropped (or the potential is raised) to inject the negative charge to N+-type diffusion layer 3. As a result, the negative charge overflows to the region formed below gates 11 and 12, as shown in FIG. 1(*e*). Then, the voltage applied to terminal ID is raised to lose the negative charge which exceeds potential level $\phi_g$, and negative charge 101 is left in the region formed below gate 12 as signal charge $Q_S$, as shown in FIG. 1(*f*).

Signal charge $Q_S$ is determined by the potential difference between potential level $\phi_g$ responsive to the voltage applied to gate 11 and potential level $\phi_s$ responsive to the voltage applied to gate 12 and by capacity Ci which depends on the area of gate 12 covering on N-type diffusion layer 2, as expressed by the following equation:

$$Q_s=Ci(\phi_g-\phi_s)/q \quad (2)$$

where q is the charge of one electron. The signal charge $Q_S$ is set to have an amount corresponding to the input signal by modulating the voltage between terminals IG and IS with the input signal. Next, the voltage at terminal H1 is raised and the voltage at terminal H2 is dropped in order to transfer the signal charge $Q_S$ to the region formed below gate 13, as shown in FIG. 1(*g*), and then the voltage at terminal H1 is dropped and the voltage at terminal H2 is raised in order to transfer signal charge $Q'_S$ to the region formed below gate 15*b*. Thus, the signal charge $Q'_S$ is transferred sequentially to the output side by raising the voltages of the clocks applied at terminals H1 and H2 alternately. Potential levels $\phi_l$ and $\phi_h$ correspond to a low level and a high level shown in FIGS. 2(*b*) and 2(*c*) of clocks H1 and H2, respectively.

In this embodiment, there is provided a $P^+$-type diffusion layer 6 in N-type diffusion layer 2 below gate 15 having gates 15*a* and 15*b* to divide signal charge $Q_S$ into two parts, one of which is signal charge $Q'_S=\beta Q_S$, where $0<\beta<1$, and another of which is $(1-\beta)Q_S$. In addition, there is also provided $N^+$-type diffusion layer 7 in both the N-type diffusion layer 2 and P-type substrate 5 as shown in FIGS. 1(*a*) and 1(*b*). Based on this structure, the signal charge $Q_S$ is attenuated to $Q'_S$ (i.e. $\beta Q_S$) through the transfer channel, and signal charge $Q'_S$ is transferred to the output side, while, on the other hand, the negative charge of $(1-\beta)Q_S$ is transferred to layer 7, and removed by a positive voltage applied to terminal SD.

Since signal charge $Q'_S$ is smaller than signal charge $Q_S$, the capacity CI' required to transfer signal charge $Q'_S$ in the transfer stage can be smaller than capacity Ci in the input stage. Therefore, obviously from equation (1), the power consumption at the transfer stage is reduced.

Since noise charge $Q_N$, which is produced at the input stage at a point in the process from a stage shown in FIG. 1(*e*) to a stage shown in FIG. 1(*f*), is also attenuated to $\beta Q_N$ in the transfer channel, the S/N ratio is hardly degraded at all despite the fact that the signal charge $Q_S$ is reduced to $\beta Q_S (=Q'_S)$.

The value $\beta$ can be freely set in accordance with the position of $P^+$-type diffusion layer 6. Although the diffusion layer 6 has been shown in FIG. 1(*a*) below the gate 15, it should be noted that it may, for example, be provided in N-type diffusion layer 2 below gate 13. The closer the diffusion layer 6 is to the input stage, the more the power consumption in the transfer stage is decreased.

Figure 2A:
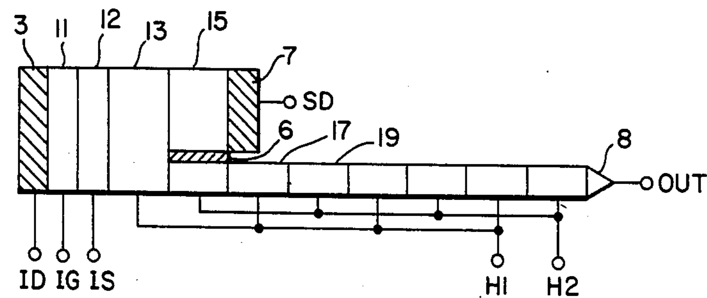
FIG. 2 shows the whole structure of the first embodiment of the present invention.
Figure 2B:
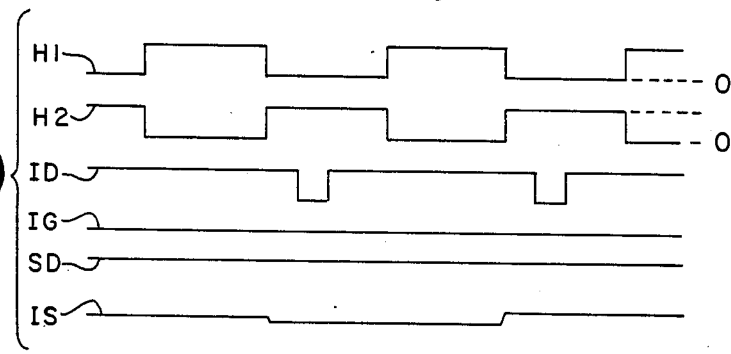
Figure 2C:
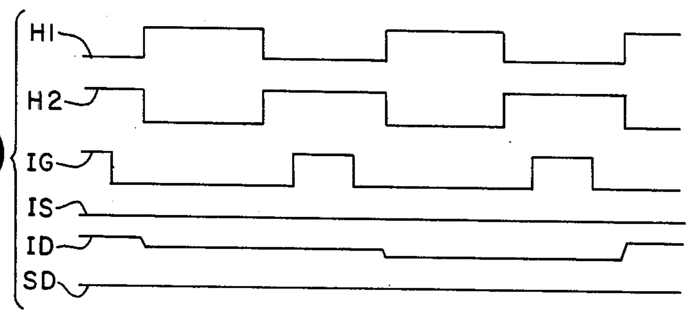
Figure 3A:
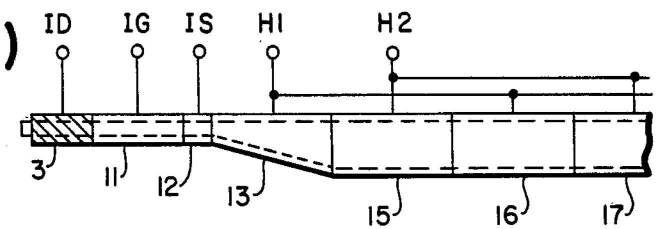
FIGS. 3 and 5 show a part of CCD delay lines in accordance with the present invention.
Figure 3B:
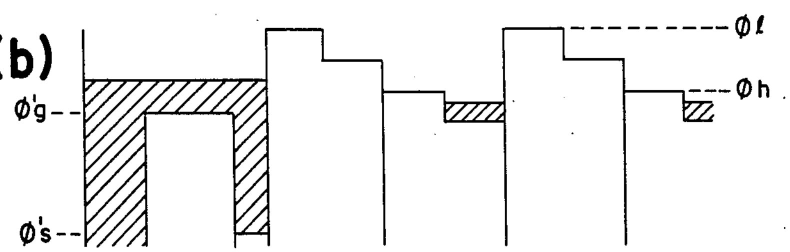
Figure 3C:
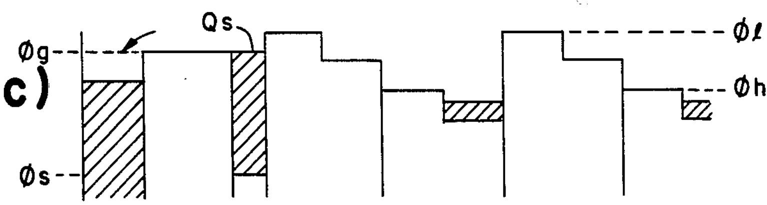
Figure 3D:
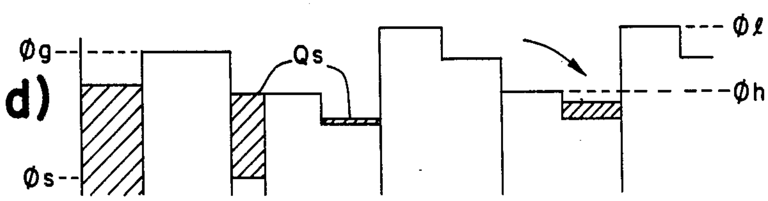
Figure 3E:
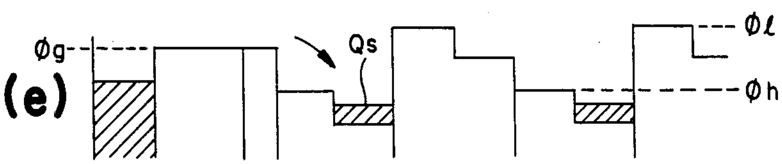
Figure 5A:
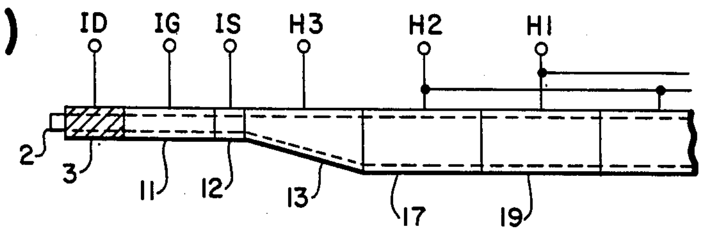
Figure 5B:
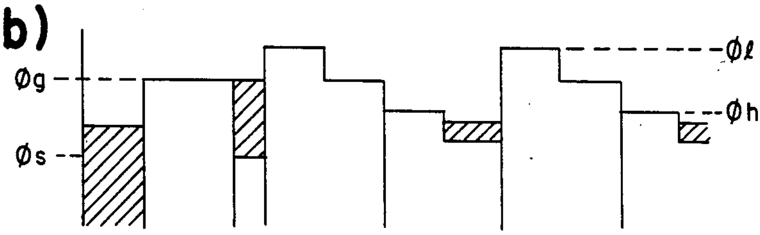
Figure 5C:
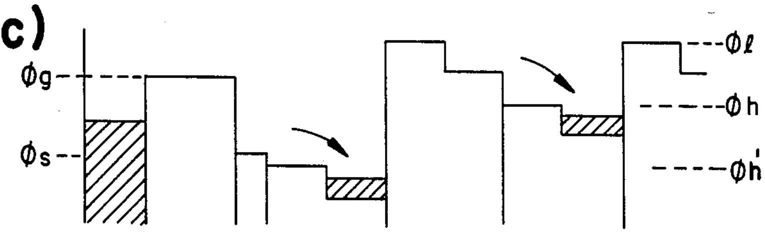
Figure 5D:
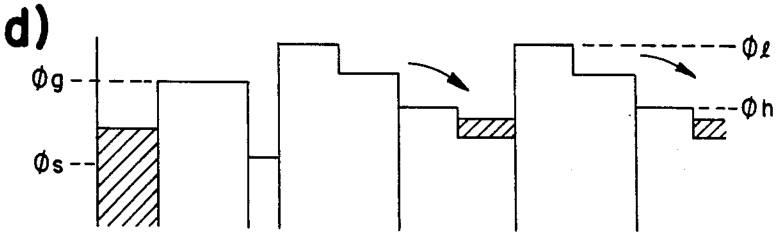

FIG. 2(*a*) shows the whole planar structure of the CCD delay line of the embodiment shown in FIG. 1, and FIG. 2(*b*) shows an example of the timing chart for this structure. Indicated at reference numeral 8 is an output amplifier which has both a function to output the transferred charge in the form of voltage to an output terminal with a low impedance with a function to release the current charge before the next charge is transferred thereto. Incidentally, a signal applied to terminal IS need not always be sample-held with the clock period. Also, FIG. 2(*a*) shows a variation of the arrangement of FIG. 1(*a*) in that the layer 7 for removing the portion of charge $(1-\beta)Q_S$ extends across the entire portion of the gate 15 in which the charge $(1-\beta)Q_S$ is present.

FIG. 2(*c*) shows another example of the timing chart in a case wherein a signal is applied to terminal ID.

In FIG. 3 showing another embodiment of the present invention, FIG. 3(*a*) shows a planar structure, and FIGS. 3(*b*) to 3(*e*) are potential diagrams corresponding to the planar structure. First of all, as shown in FIG. 3(*b*), a high negative voltage is applied to gates 11 and 12, and negative charge is injected to the region below the gate 12. Next, as shown in FIG. 3(*c*), the voltage at the gate 11 is dropped, and the signal charge $Q_S$ is left in the region below gate 12 which is determined by the potential $(\phi_g-\phi_s)$. At a next timing shown in FIG. 3(*d*), the clock applied to terminal H1 takes a high negative potential to transfer a portion of the signal charge $Q_S$ to the region below gate 13. Next, as shown in FIG. 3(*e*), the potential at the gate 12 is further dropped to transfer all the residual charge $Q_S$ to the region below gate 13, thus finishing the injection of the signal charge $Q_S$. According to this injection method, the voltage applied to the gate 12 is raised at the timing in FIG. 3(*c*) so that signal charge $Q_S$ can be enlarged more than the limit expressed by equation (2), thereby to improve the S/N ratio.

FIG. 4(*a*) shows the whole planar structure of the CCD delay line of the embodiment shown in FIG. 3, and FIG. 4(*b*) shows an example of the timing chart. In accordance with the signal, the voltage at the gate 12 is modulated within a range from $V_4$ to $V_5$ at timings $t_1$, $t_2$ and $t_3$. Here, voltage $V_5$ corresponds to potential $\phi_g$ below the gate 12 and voltage $V_4$ is at a voltage equal to $(V_3+V_2-V_1)$.

In FIG. 5 showing still another embodiment of the present invention, FIG. 5(*a*) shows a planar structure, and FIGS. 5(*b*) to 5(*d*) are potential diagrams corresponding to the planar structure. This embodiment is characterized in that gate 13 is driven by a higher amplitude voltage at H3 than other gates which follow gate 13. Also capacity Ci formed below gate 12 is made smaller than that formed below other gates 13, 15, 17, 19, etc. Since the amplitude for gate 13 is made larger than that of the example in FIG. 2, the potential difference $(\phi_g-\phi_s)$ can be enlarged to prevent signal charge $Q_S$ from being reduced even with the low capacity, thereby to improve the S/N ratio.

Since noise charge $Q_N$ present in the region below gate 13 is determined by the following equation:

$$Q_N=\sqrt{\tfrac{2}{3}kTCi} \tag{3}$$

where k is the Boltzman constant,

T is the absolute temperature, and

Ci is the area under the input gate 12 where the noise is initially generated, and since the S/N ratio is expressed by the following equation:

$$Q_S/Q_N \propto \sqrt{Ci}\,(\phi_g-\phi_s)=Q_S/\sqrt{Ci}=\sqrt{Q_S\cdot(\phi_g-\phi_s)}\,, \tag{4}$$

it is preferable to enlarge potential $(\phi_g-\phi_s)$ and to decrease capacity Ci in order to improve the S/N ratio in the case obtaining the same signal charge $Q_S$. The driving power is only slightly increased because the capacities and pulse amplitude in the transfer stage are unchanged except for a pulse amplitude for gate 13.

Figure 6A:
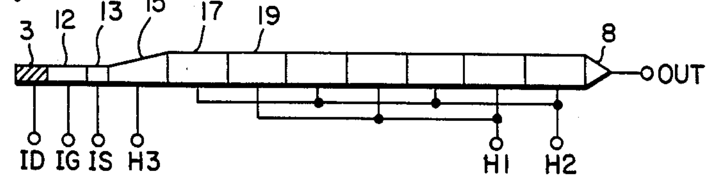
Figure 6B:
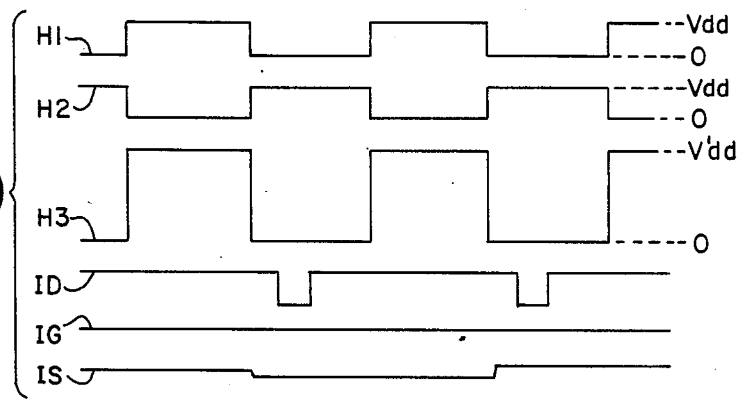
Figure 6B:
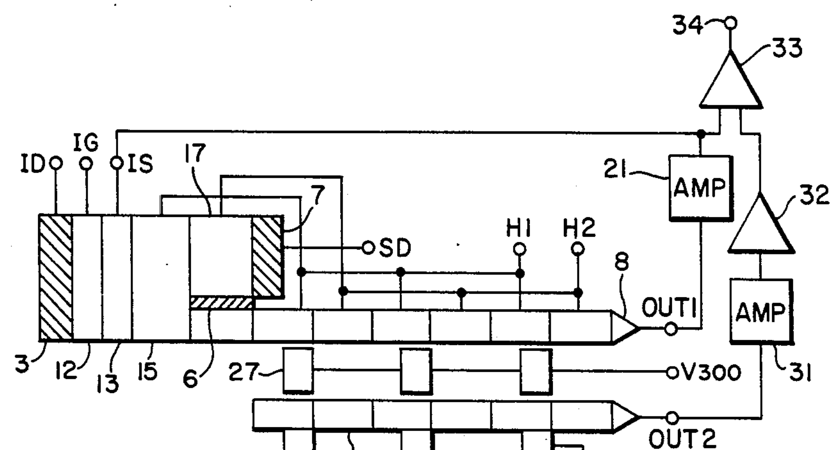

FIG. 6(*a*) shows the whole planar structure of the CCD delay line of the embodiment shown in FIG. 5, and FIG. 6(*b*) is a timing chart showing an example in which a signal is applied to the gate 13.

FIG. 7 shows an example in which the CCD delay line of the present invention is applied to the horizontal CCD of an image pickup element and which is given the function of a cyclic comb-shaped filter by multiplying the output charge by $K(0<K<1)$ and inputting and multiplied charge again. Since the comb-shaped filter is intended to improve the S/N ratio, it is necessary to notice especially the S/N degradation at the input stage of the CCD delay line. Because of the restriction of $K<1$, moreover, the S/N ratio cannot be raised by increasing signal charge $Q_S$. In view of this point, the CCD delay line according to the present invention becomes effective for such application.

Indicated at reference numeral 21 is a noise reducing amplifier which has a function such as a correlated double sampling function to suppress the noise at output amplifier 8. Indicated at numeral 22 is a vertical CCD for transferring charge in a vertical direction. Numerals 23 and 24 indicate a transfer gate and a photodiode, respectively. Terminals $V_{100}$ and $V_{200}$ are applied with clocks of vertical CCD 22, which are connected with all vertical CCD 22 like the right-hand end, although the wiring is not shown in the drawings. In a vertical fly-back period, a positive pulse is applied to terminal TG to transfer the signal charge in the photodiode to vertical CCD 22. In a horizontal fly-back period in the vertical scanning period, the signal charge in vertical CCD 22 is transferred upward stage by stage, and the signal charge of one row is transferred to a horizontal CCD (which is formed by the CCD delay line from layer 3 to output amplifier 8 in this embodiment). For a horizontal scanning period, the signal charge of the horizontal CCD is sequentially shifted so that a video signal is generated at terminal OUT. At the same time, the output signal is fed back through the noise reducing amplifier 21 to the terminal IS (or IG or ID) and transformed into the signal charge $Q_S$, which is then transferred on the horizontal CCD and added to the signal charge in a common column in a subsequent row for a subsequent horizontal scanning period. The gain K of this feedback loop is set at $0<K<1$, and it is enlarged when the S/N ratio improving effect is to be enhanced.

Figure 8:
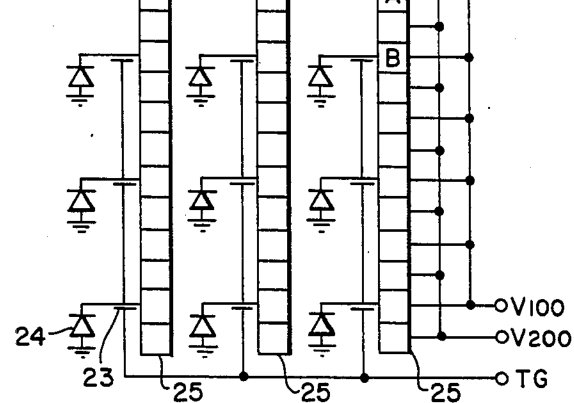

FIG. 8 shows another example in which the CCD delay line of the present invention is applied to the horizontal CCD of an image pickup element. The use of the CCD delay line of the present invention is intended to detect the unnecessary charge such as vertical smear at a high S/N ratio. Reference numeral 25 indicates a vertical CCD; numeral 26 a horizontal CCD for signal charge transfer; numeral 27 a transfer gate which is controlled by a clock signal applied to terminal 300; and numeral 31 a noise reducing amplifier for suppressing the noise at the output portion of the horizontal CCD by the correlated double sampling or the like. Numerals 32 and 33 indicate an amplifier and a differential amplifier, respectively, in which the vertical smear is cancelled. Numeral 34 indicates a signal output terminal. An equal amount of vertical smear charge is stored in the region below every gate, such as A and B, of the vertical CCD 25. In the region below the gate of B, there is also stored the signal charge which has been transferred.

In the horizontal fly-back period, the vertical smear charge of A is transferred through horizontal CCD 26 and transfer gate 27 to the horizontal CCD for the vertical smear transfer. Next, the signal charge and the vertical smear charge of B are transferred to horizontal CCD 26. The horizontal CCD for the vertical smear transfer and horizontal CCD 26 are operated at a common clock so that the vertical smear is outputted at terminal OUT1 whereas the signal and the vertical smear are concurrently outputted at terminal OUT2. If a difference is taken from the two, a video signal of high image quality without any vertical smear can be produced. The S/N ratio is degraded by 3 db if the difference is merely taken. For this reason, the horizontal CCD for the vertical smear is used as the cyclic comb-shaped filter to improve the S/N ratio of the vertical smear outputted from terminal OUT1. Since an equal amount of the vertical smear exists in every picture element in one column, the S/N ratio can be drastically improved by making the feedback ratio K approach 1 so that the degradation of the S/N ratio resulting from the cancelling of the vertical smear can be substantially eliminated.

Figure 9:
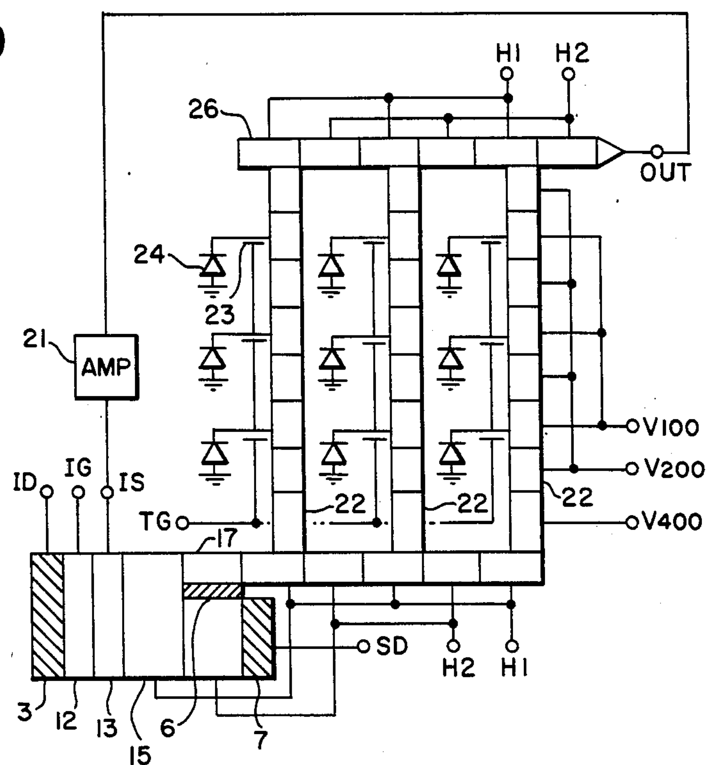

FIG. 9 shows another example in which the CCD delay line of the present invention is applied to the horizontal CCD of the image pickup element and in which a cyclic filter of field period is constructed to improve the S/N ratio and to suppress the flickering phenomena in the illumination of a fluorescent lamp.

The gate of vertical CCD, which gate is connected to the horizontal CCD, is controlled by another clock applied to terminal V400.

Figure 10:
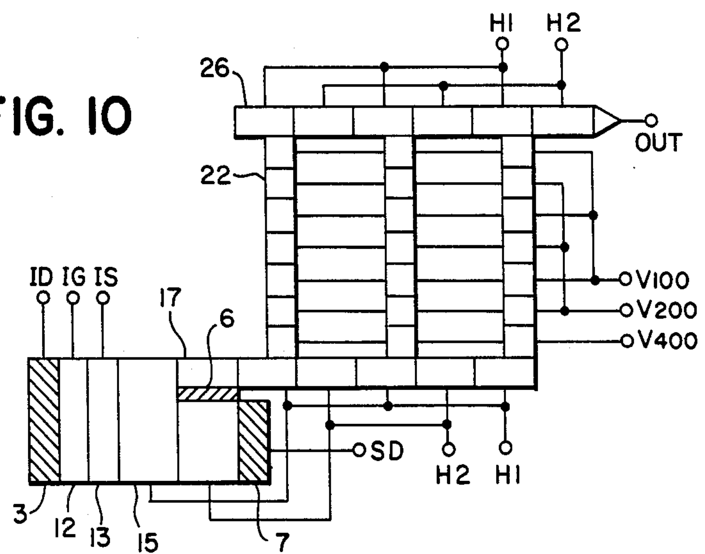

FIG. 10 shows an example in which the CCD delay line of the present invention is applied to a field delay line. From the description thus far made, it could be understood that a field delay line of low power consumption having a high S/N ratio can be provided.

In the applied examples shown in FIGS. 7 to 10, incidentally, the description has been made by using the CCD delay lines of the embodiments of FIGS. 1 and 2. Despite this fact, however, the similar effects of the high S/N ratio and the low driving power can be attained even by replacing the CCD delay lines by those shown in FIGS. 3 to 6.

Throughout the present specification, moreover, the description has been directed to the CCDs which use a two-phase buried channel. Despite this fact, too, the object can be achieved by a similar concept even if the CCD is replaced by a CCD of surface channel type or a three-, four- or multi-phase CCD.

I claim:

1. A charge coupled device comprising:

input means for producing a signal charge in response to an electrical signal applied thereto; and transfer means, having a first end coupled to said input means and a second end, for transferring said signal charge from said first end to said second end, said transfer means including means adjacent to said first end thereof for decreasing said signal charge to be transferred to said second end.

2. A charge coupled device in accordance with claim 1, wherein said signal charge decreasing means divides said signal charge flowing through said first end thereof into two parts, one part of said signal charge being transferred to said second end, and another part of said signal charge being transferred to a predetermined potential.

3. A charge coupled device in accordance with claim 2, wherein said transfer means has a plurality of potential wells wherein said signal charge is sequentially stored and transferred, and wherein one potential well adjacent to said first end of said transfer means is divided into two parts, one part of said potential well being succeeded with other potential well, and another part of said potential well being coupled to a voltage source.

4. A charge coupled device comprising:

a channel of semiconductor material;

a plurality of gates provided on said channel in a predetermined longitudinal direction; and means for producing in a first region beneath one end gate of said plurality of gates a charge to be transferred in said channel from said first region to a second region beneath another end gate at an opposite end of said plurality of gates, the area of said first gate being smaller than that of other gates of said plurality of gates.

* * * * *